US012658853B2

(12) United States Patent
Young

(10) Patent No.: US 12,658,853 B2
(45) Date of Patent: Jun. 16, 2026

(54) ULTRA-LOW PHASE NOISE TRANSFER OSCILLATOR MICROWAVE REFERENCE VIA PHASE MODULATED MODE-LOCKED LASER FEEDBACK

(71) Applicant: Raytheon Company, Tewksbury, MA (US)

(72) Inventor: Darrell L. Young, Quinlan, TX (US)

(73) Assignee: Raytheon Company, Arlington, VA (US)

(*) Notice: Subject to any disclaimer, the term of this patent is extended or adjusted under 35 U.S.C. 154(b) by 0 days.

(21) Appl. No.: 18/667,645

(22) Filed: May 17, 2024

(65) Prior Publication Data

US 2025/0357893 A1 Nov. 20, 2025

(51) Int. Cl.
| | |
|---|---|
| *H03B 17/00* | (2006.01) |
| *G02F 1/355* | (2006.01) |
| *H01S 3/00* | (2006.01) |
| *H01S 3/1106* | (2023.01) |
| *H01S 3/13* | (2006.01) |
| *H01S 3/16* | (2006.01) |

(52) U.S. Cl.
CPC ........... *H03B 17/00* (2013.01); *G02F 1/3551* (2013.01); *G02F 1/3558* (2013.01); *H01S 3/0092* (2013.01); *H01S 3/1106* (2013.01); *H01S 3/1305* (2013.01); *H01S 3/1307* (2013.01); *H01S 3/1671* (2013.01); *G02F 2202/20* (2013.01)

(58) Field of Classification Search
CPC .............................. H03B 17/00; H01S 3/1305
See application file for complete search history.

(56) References Cited

U.S. PATENT DOCUMENTS

| | | | |
|---|---|---|---|
| 10,009,103 B2 | 6/2018 | Vahala et al. | |
| 10,454,238 B2 | 10/2019 | Fermann et al. | |
| 2018/0048113 A1* | 2/2018 | Fermann | H01S 3/06712 |

OTHER PUBLICATIONS

Brochard, Pierre, Stéphane Schilt, and Thomas Südmeyer. "Ultra-low noise microwave generation with a free-running optical frequency comb transfer oscillator." Optics letters 43.19 (2018): 4651-4654. (Year: 2018).*

Nardelli et al., "10 GHz generation with ultra-low phase noise via the transfer oscillator technique", APL Photonics, 7, 026105, Feb. 8, 2022, 11 pages.

Guo et al., "Ultrafast mode-locked laser in nanophotonic lithium niobate", Science, vol. 382, Issue 6671, Nov. 2023, 11 pages.

Sun et al., "Integrated optical frequency division for microwave and mmWave generation", Nature, vol. 627, Mar. 21, 2024, 7 pages.

* cited by examiner

*Primary Examiner* — Ryan Johnson

(57) ABSTRACT

A system includes a mode-locked laser (MLL) configured to receive a first radio frequency (RF) reference signal, and based on the first RF reference signal, generate an optical frequency comb (OFC). The system further includes a wavelength conversion medium configured to receive the OFC, and based on the OFC, generate at least one photonic reference signal. The system further includes a transfer oscillator (TO) circuit configured to receive the OFC and the at least one photonic reference signal, and generate the first RF reference signal based on the OFC and the at least one photonic reference signal.

20 Claims, 2 Drawing Sheets

ULTRA-LOW PHASE NOISE TRANSFER OSCILLATOR MICROWAVE REFERENCE VIA PHASE MODULATED MODE-LOCKED LASER FEEDBACK

TECHNICAL FIELD

This disclosure generally relates to generating microwave radio frequency signals. More specifically, this disclosure relates to an ultra-low phase noise transfer oscillator (TO) microwave reference via phase modulated (PM) mode-locked laser (MLL) feedback.

BACKGROUND

Many electronic systems such as communications, radar and computing systems rely on frequency references for operation. Extremely low phase noise is desirable from these frequency references in particular applications. For example, low phase noise enhances the ability for a radar to detect slow moving targets, or to resolve multiple fast-moving targets. Similarly, low phase noise enables high order symbol constellations in QAM communications applications. Therefore, frequency references with ultra-low phase noise are desirable.

SUMMARY

This disclosure relates to an ultra-low phase noise transfer oscillator (TO) microwave reference via phase modulated (PM) mode-locked laser (MLL) feedback.

In a first embodiment, a system is provided. The system includes a mode-locked laser (MLL) configured to receive a first radio frequency (RF) reference signal, and based on the first RF reference signal, generate an optical frequency comb (OFC). The system further includes a wavelength conversion medium configured to receive the OFC, and based on the OFC, generate at least one photonic reference signal. The system further includes a transfer oscillator (TO) circuit configured to receive the OFC and the at least one photonic reference signal, and generate the first RF reference signal based on the OFC and the at least one photonic reference signal. The system may further comprise a plurality of TO channels. Each TO channel may be configured to generate a processed RF signal based on the at least one photonic reference signal. To generate the first RF reference signal, the TO circuit may be configured to coherently sum the processed RF signal from each TO channel.

In a second embodiment, a method is provided. The method includes generating, by a MLL, an OFC, and generating, by a wavelength conversion medium, based on the OFC, at least one photonic reference signal. The method further includes generating, by a TO circuit, based on the OFC and the at least one photonic reference signal, a first RF reference signal, and modulating a phase of the MLL based on the first RF reference signal. The TO circuit may comprise a plurality of TO channels. The method may further include coherently summing a processed RF signal from each TO channel based on the at least one photonic reference signal to generate the first RF reference signal.

In a third embodiment, a TO circuit is provided. The TO circuit includes at least one TO channel. Each TO channel includes an x-band filter configured to receive a first RF signal, and generate a first filtered RF signal. Each TO channel further includes a plurality of direct digital synthesizers (DDSs), each DDS configured to receive a photonic reference signal, and generate an xth RF signal based on the photonic reference signal. Each TO channel is configured to generate a processed RF signal based on the first filtered RF signal and each of the xth RF signals. The TO circuit may be further configured to coherently sum the processed RF signal from each TO channel to generate the first RF reference signal.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
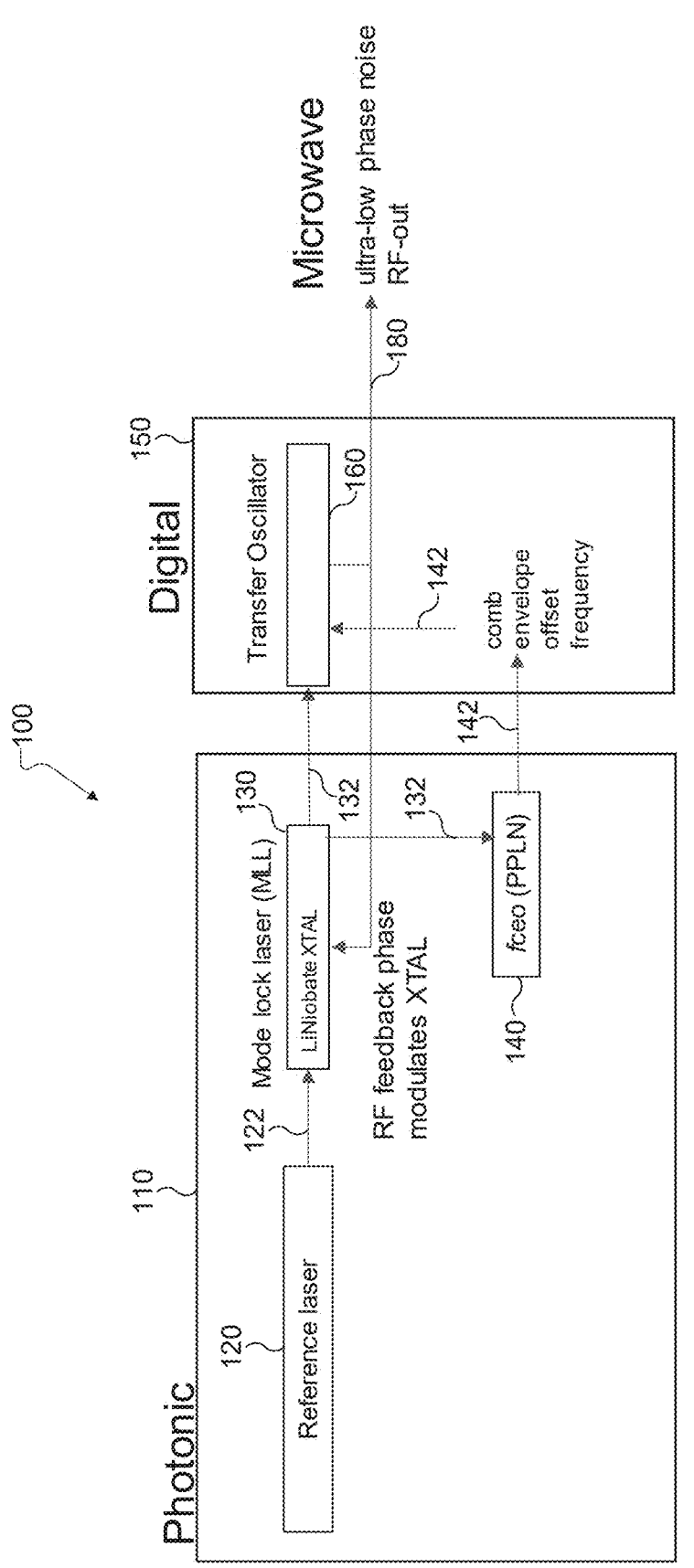
FIG. 1 illustrates an example system supporting an ultra-low phase noise transfer oscillator microwave reference via phase modulated mode-locked laser feedback correction in accordance with this disclosure.
Figure 2:
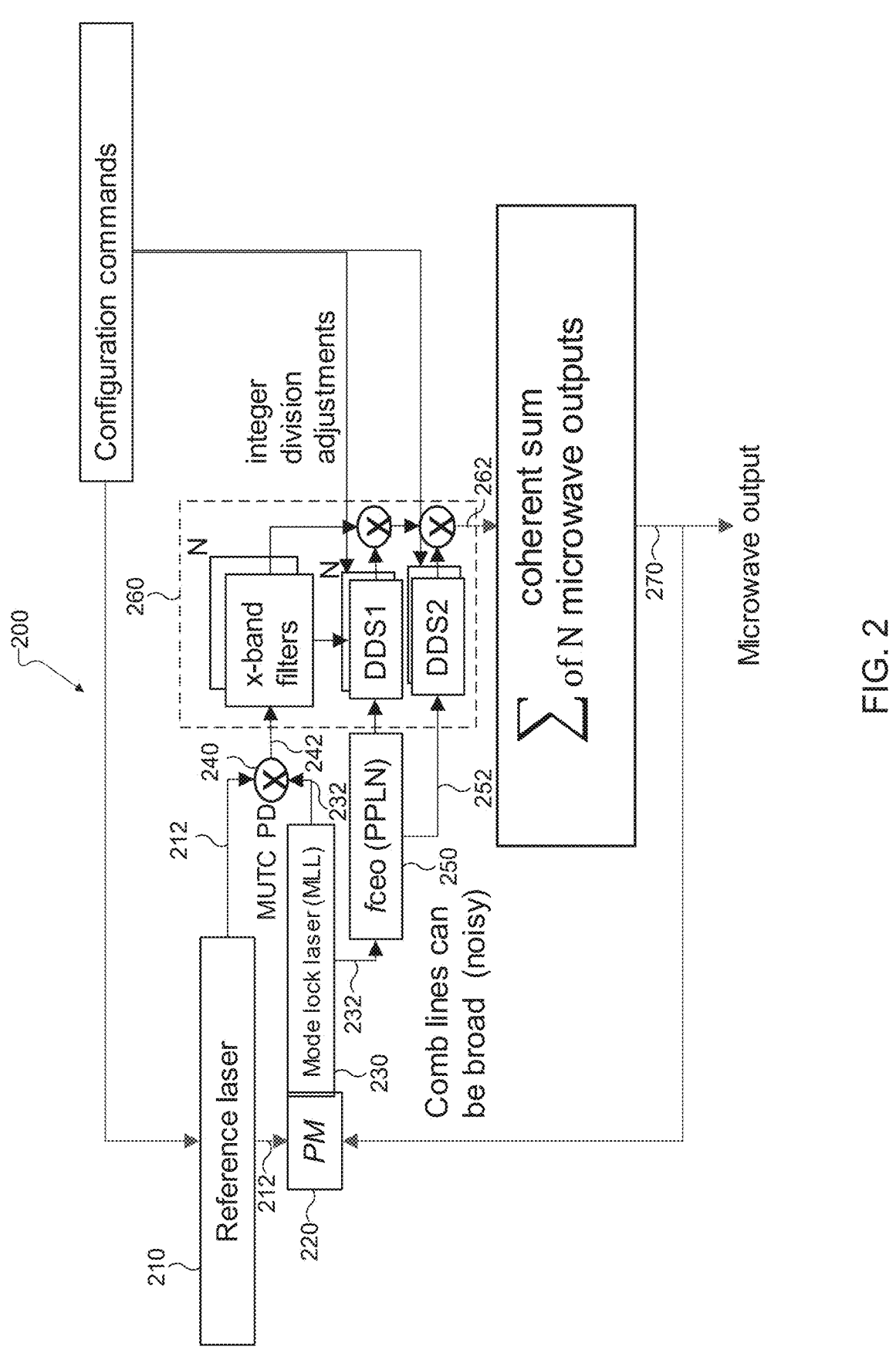
FIG. 2 illustrates another example system supporting an ultra-low phase noise transfer oscillator microwave reference via phase modulated mode-locked laser feedback correction in accordance with this disclosure.

FIGS. 1 through 2, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, extremely low phase noise is desirable for frequency references in particular applications, such as radar and communications systems. One example source of a low phase noise output signal is a mode-locked laser (MLL), such as a lithium niobate MLL. A mode-locked laser generates pulses of extremely short duration. In one implementation of an MLL, a phase modulator (PM) driven by an RF signal electro-optically modulates the cavity of the MLL to produce the pulsed output. To ensure low phase noise from the MLL, the PM should be driven by an RF signal with as low of a noise as possible.

In order for the output of an MLL to be useful as an RF reference, the photonic output of the MLL must be converted into RF output. For example, the photonic output, such as an optical frequency comb (OFC), of the MLL could be converted into an RF output using the transfer oscillator (TO) technique. The TO technique provides employs electronics to add, subtract, and divide RF signals in order to remove OFC phase noise. When using an MLL as the input source, the transfer oscillator technique may generate an RF output with an extremely low phase noise. The TO technique has an advantage because optical frequency division (OFD) may be performed without phase-locking to an optical reference. Therefore, the TO technique allows for simultaneous generation of multiple microwave signals based on independent optical references. Furthermore, the TO approach moves difficult photonic integration problems to the digital domain where there is much more design flexibility. For example, the TO technique converts signals digitally with much less expense than other techniques. For instance, dividing the difference of two optical frequency comb teeth 30 GHz apart to a 10 GHZ output may be accomplished by dividing by three. Achieving the same result with a photonic device is much more complex.

The phase noise of an oscillator is often above the specifications for the particular application. In situations such as these, various methods may be employed to reduce the phase noise. For example, if the reference signal used to drive the MLL is a crystal oscillator, the reference signal may drift over time due to the effects of the environment. This may lower the ability of the TO technique to produce a signal with a sufficiently low phase noise. To provide the TO technique with the best opportunity to generate an extremely low phase noise signal, the MLL should utilize a reference signal with as low of a phase noise as possible. For example, the MLL could utilize the RF signal generated by the TO technique (which has an extremely low phase noise) as feedback to drive the PM of the MLL. This should provide the MLL with an extremely low phase noise RF signal, and in turn, the TO technique should have a similarly lower phase noise input received from the MLL. Another advantage of such a system as that the MLL does not require another source to generate the signal to drive the PM. An example of such a system is illustrated in FIG. 1.

FIG. 1 illustrates an example system 100 supporting an ultra-low phase noise transfer oscillator (TO) microwave reference via phase modulated (PM) mode-locked laser (MLL) feedback correction in accordance with this disclosure. As shown in FIG. 1, the system 100 includes a photonic portion 110 and a digital portion 150. Photonic portion 110 includes a reference laser 120, a lithium niobate crystal (LiNiobate XTAL) 130, and a periodically poled lithium niobate (PPLN) waveguide 140. The digital portion includes a transfer oscillator (TO) circuit 160.

Reference laser 120 generates a reference photonic signal 122 which is phased modulated by LiNiobate XTAL 130 based on RF feedback. This creates a mode-locked laser (MLL) generating an output signal 132, which is an optical frequency comb (OFC). In some embodiments, system 100 may include additional references lasers 120 to generate additional photonic signals 122. The plurality of photonic signals 122 may be coherently combined, and output signal 132 may be generated based on the coherently combined photonic signals 122. Output signal 132 is received by PPLN waveguide 140. PPLN waveguide 140 outputs at least one output signal 142 which is based on a tooth from the OFC of output signal 132. Output signal 142 is a comb envelope offset frequency (fceo) of output signal 132. In some embodiments, output signal 142 may be based on multiple teeth from the OFC of output signal 132. For example, two or more teeth from output signal 132 may be coherently combined, and output signal 142 may be based on the coherently combined signal from the two or more teeth from output signal 132. Although system 100 as illustrated includes PPLN waveguide 140, it should be understood that PPLN waveguide 140 may be replaced with any suitable wavelength conversion medium. For example, a β-BBO (beta-BaB2O4) Crystals Optimized for Type-I or a Postassium Diduerterium Phosphate (and its isomorphs, KDP, KD*P (DKDP) can be used as non-linear crystals for Second Harmonic Generation (SHG) in place of PPLN.

Transfer oscillator circuit 160 receives output signal 132 and output signal 142, and processes output signal 132 and output signal 142 into a microwave radio frequency (RF) output 180. RF output 180 has an ultra-low phase noise, and is fed back to LiNiobate XTAL 130 for phase modulation of LiNiobate XTAL 130 based on RF output 180.

Although FIG. 1 illustrates one example of a system 100 supporting an ultra-low phase noise TO microwave reference via PM MLL feedback, various changes may be made to FIG. 1. For example, the system 100 may be used in any suitable environment and for any suitable purpose. Also, while shown here as being used to generate a reference microwave radio frequency, the system can be used in any number of other ways depending on the application. For example, the system 100 may be used to generate a radio frequency in any band, and is not limited to the microwave band.

While FIG. 1 describes a system that should provide an extremely low phase noise RF output, additional techniques may be applied to further improve the phase noise performance. For example, a plurality of oscillators may be phase locked to a common reference signal, and the output from the plurality of oscillators may be coherently combined into a single signal. This may be referred to as a phase-coherent oscillator array. The output from the phase-coherent oscillator array has a lower phase noise than any individual oscillator, because when multiple sources are combined, the power of each source adds coherently, while the random noise adds non-coherently.

For example, the output from the MLL may be used to drive multiple transfer oscillators according to the TO technique to generate a plurality of phase-coherent oscillator outputs. The plurality of phase-coherent oscillator outputs can then be combined into a coherent sum to provide a reference RF signal with even better phase-noise than any of the individual transfer oscillator outputs. The coherent sum may then be used to drive the PM of the MLL, similar as previously described. This system provides an ultra-low phase noise signal for both the MLL, and any other system (e.g., a radar) that my need the ultra-low phase noise signal. An example of such a system is illustrated in FIG. 2.

FIG. 2 illustrates another example system 200 supporting an ultra-low phase noise transfer oscillator (TO) microwave reference via phase modulated (PM) mode-locked laser (MLL) feedback correction in accordance with this disclosure.

As shown in FIG. 2, the system 200 includes a reference laser 210, a phase modulator (PM) 220, a mode-locked laser (MLL) 230, a modified uni-traveling carrier photodiode (MUTC PD) 240, a PPLN waveguide 250, and a transfer oscillator (TO) circuit 260.

Reference laser 210 generates a reference photonic signal 212. Reference photonic signal 212 is modulated by PM 220 according to a radio frequency (i.e., RF output 270) such that MLL 230 generates an optical frequency comb (OFC) 232. In some embodiments, system 200 may include additional references lasers 210 to generate additional photonic signals 212. The plurality of photonic signals 212 may be coherently combined prior to modulation by PM 220, and output signal 132 may be generated based on the coherently combined photonic signals 212. It should be understood that reference signal 212 as used herein may refer to a single reference signal 212, or multiple reference signals 212 coherently combined into a single reference signal. Reference signal 212 and OFC 232 are combined. Optical interference between reference signal 212 and the optical modes of OFC 232 creates optical beat signals which are detected by MUTC PD 240 creating an RF output 242 which is received by TO circuit 260. OFC 232 is also received by PPLN waveguide 250, which outputs at least one output signal 252 which is based on a tooth from OFC 232. Output signal 252 is a comb envelope offset frequency (fceo) of OFC 232. In some embodiments, output signal 252 may be based on multiple teeth from the OFC of output signal 232. For example, two or more teeth from output signal 232 may be coherently combined, and output signal 252 may be based on the coherently combined signal from the two or more teeth from output signal 232. Although system 200 as illustrated includes PPLN waveguide 250, it should be understood that PPLN waveguide 250 may be replaced with any suitable wavelength conversion medium. For example a β-BBO (beta-BaB2O4) Crystals Optimized for Type-I or a Postassium Diduerterium Phosphate (and its isomorphs, KDP, KD*P (DKDP) can be used as non-linear crystals for Second Harmonic Generation (SHG) in place of PPLN.

TO circuit 260 comprises N transfer oscillator channels creating a phase-coherent oscillator array. Each TO channel includes an x-band filter and a plurality of direct digital synthesizers (DDSs). For each TO channel, the x-band filter receives RF output 242, and each direct digital synthesizer receives one of the at least one output signal 252. Based on configuration commands sent to the reference laser and the DDSs the DDSs generate RF signals based on the received output signal 252. These RF signals are combined with the RF signal filtered by the x-band filter to generate an RF output 262 according to the transfer oscillator technique. For example, each TO channel may generate an RF output based on a particular tooth from OFC 232.

Each of the RF outputs 262 generated from each of the various TO channels N from TO circuit 260 are coherently summed into an RF output 270. RF output 270 has a lower phase noise than the phase noise of any of the RF outputs 262. RF output 270 is fed to PM 220 to modulate MLL 230.

Although FIG. 2 illustrates one example of a system 200 supporting an ultra-low phase noise TO microwave reference via PM MLL feedback, various changes may be made to FIG. 2. For example, the system 200 may be used in any suitable environment and for any suitable purpose. Also, while shown here as being used to generate a reference microwave radio frequency, the system can be used in any number of other ways depending on the application. For example, the system 200 may be used to generate a radio frequency in any band, and is not limited to the microwave band. Furthermore, while each TO channel is illustrated as utilizing a single x-band filter and a first and second DDS, any TO channel of the system may utilize any number of filters or DDSs, and is not limited to the configuration shown in FIG. 2.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
    a mode-locked laser (MLL) configured to:
        receive a first radio frequency (RF) reference signal, and
        based on the first RF reference signal, generate an optical frequency comb (OFC);
    a wavelength conversion medium configured to:
        receive the OFC, and
        based on the OFC, generate at least one photonic reference signal; and
    a transfer oscillator (TO) circuit comprising a plurality of TO channels, the TO circuit configured to:
        receive the OFC and the at least one photonic reference signal,
        generate, via each TO channel, a respective processed RF signal based on the OFC and the at least one photonic reference signal, and
        coherently sum each respective processed RF signal to generate the first RF reference signal.

2. The system of claim 1, wherein the at least one photonic reference signal corresponds with a tooth from the OFC.

3. The system of claim 1, further comprising:
    at least one reference laser configured to generate a photonic signal; and a modified uni-traveling carrier photodiode (MUTC PD), wherein:

the MUTC PD is configured to:

receive a combination of the photonic signal and the OFC; and generate a first RF signal based on the combination of the photonic signal the OFC;

receiving the OFC by the TO circuit comprises receiving the first RF signal; and the wavelength conversion medium is a periodically poled lithium niobate waveguide.

4. The system of claim 3, wherein the at least one reference laser comprises a plurality of reference lasers, and the photonic signal is generated by coherently combining an output of the plurality of reference lasers.

5. The system of claim 3, wherein each TO channel comprises:

an x-band filter configured to:

receive the first RF signal; and generate a first filtered RF signal;

a plurality of direct digital synthesizers (DDSs), each DDS configured to:

receive one of the at least one photonic reference signal; and generate an xth RF signal based on the one of the at least one photonic reference signal, wherein each TO channel is configured to generate the respective processed RF signal based on the first filtered RF signal and each of the xth RF signals.

6. The system of claim 5, wherein the respective processed RF signal from each TO channel corresponds with a particular tooth from the OFC.

7. The system of claim 3, wherein:

the MLL comprises:

a lithium niobate crystal, and a phase modulator (PM); and generating the OFC comprises modulating the photonic signal with the phase modulator according to the first RF reference signal into the lithium niobate crystal.

8. A method comprising:

generating, by a mode-locked laser (MLL), an optical frequency comb (OFC);

generating, by a wavelength conversion medium, based on the OFC, at least one photonic reference signal;

generating, by each of a plurality of transfer oscillator (TO) channels of a TO circuit, a respective processed RF signal based on the OFC and the at least one photonic reference signal;

coherently summing each respective processed RF signal to generate a first radio frequency (RF) reference signal; and modulating a phase of the MLL based on the first RF reference signal.

9. The method of claim 8, wherein the at least one photonic reference signal corresponds with a tooth from the OFC.

10. The method of claim 9, further comprising:

generating, by at least one reference laser, a photonic signal;

receiving, by a modified uni-traveling carrier photodiode (MUTC PD), a combination of the photonic signal and the OFC; and generating, by the MUTC PD, based on the combination of the photonic signal the OFC, a first RF signal, wherein receiving the OFC by the TO circuit comprises receiving the first RF signal, and the wavelength conversion medium is a periodically poled lithium niobate waveguide.

11. The method of claim 10, wherein the at least one reference laser comprises a plurality of reference lasers, and the photonic signal is generated by coherently combining an output of the plurality of reference lasers.

12. The method of claim 10, wherein generating, by each of the plurality of TO channels, the respective processed RF signal comprises, for each of the plurality of TO channels:

receiving, by an x-band filter, the first RF signal;

generating, by the x-band filter, a first filtered RF signal;

for each of a plurality of direct digital synthesizers (DDSs):

receiving one of the at least one photonic reference signals; and generating an xth RF signal based on the one of the at least one photonic reference signal; and generating the respective processed RF signal based on the first filtered RF signal and each of the xth RF signals.

13. The method of claim 11, wherein the respective processed RF signal from each TO channel corresponds with a particular tooth from the OFC.

14. The method of claim 10, wherein generating, by the MLL, the OFC comprises modulating the photonic signal with a phase modulator (PM) according to the first RF reference signal into a lithium niobate crystal.

15. A transfer oscillator (TO) circuit comprising at least one TO channel, each TO channel comprising:

an x-band filter configured to:

receive a first RF signal; and generate a first filtered RF signal; and a plurality of direct digital synthesizers (DDSs), each DDS configured to:

receive a photonic reference signal; and generate an xth RF signal based on the photonic reference signal, wherein each TO channel is configured to generate a processed RF signal based on the first filtered RF signal and each of the xth RF signals; and wherein the TO circuit is configured to:

coherently sum the processed RF signal from each TO channel; and generate a first RF reference signal based on the coherent sum.

16. The TO circuit of claim 15, wherein the first RF signal is generated based on an optical frequency comb (OFC).

17. The TO circuit of claim 16, wherein the processed RF signal from each TO channel corresponds with a particular tooth from the OFC.

18. The TO circuit of claim 16, wherein the photonic reference signal corresponds with a tooth from the OFC.

19. The TO circuit of claim 18, wherein the first RF signal is generated based on the combination of a photonic signal and the OFC.

20. The TO circuit of claim 16, wherein the OFC is generated based on the first RF reference signal.

* * * * *